United States Patent
Baskaran et al.

(10) Patent No.: US 8,852,417 B2
(45) Date of Patent: ***Oct. 7, 2014

(54) ELECTROLYTIC PROCESS USING ANION PERMEABLE BARRIER

(75) Inventors: Rajesh Baskaran, Kalispell, MT (US); Robert W. Batz, Jr., Kalispell, MT (US); Bioh Kim, Milford, CT (US); Tom L. Ritzdorf, Bigfork, MT (US); John Lee Klocke, Kalispell, MT (US); Kyle M. Hanson, Kalispell, MT (US)

(73) Assignee: APPLIED Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/406,387

(22) Filed: Feb. 27, 2012

(65) Prior Publication Data

US 2012/0152751 A1   Jun. 21, 2012

Related U.S. Application Data

(60) Continuation of application No. 11/416,659, filed on May 3, 2006, now Pat. No. 8,123,926, which is a (Continued)

(51) Int. Cl.
*C25D 17/02* (2006.01)
*C25D 7/12* (2006.01)
(Continued)

(52) U.S. Cl.
CPC .......... *C25D 17/002* (2013.01); *H01L 21/2885* (2013.01); *H01L 21/76846* (2013.01); *H05K 3/423* (2013.01); *C25F 3/02* (2013.01); *H01L 21/76868* (2013.01); *C25D 17/001* (2013.01); *C25D 5/022* (2013.01); *C25D 3/38* (2013.01); *H01L 21/76873* (2013.01)

USPC .............. 205/98; 205/123; 205/157; 204/252

(58) Field of Classification Search
None
See application file for complete search history.

(56) References Cited

U.S. PATENT DOCUMENTS

| 4,110,176 A | 8/1978 | Creutz |
| 4,163,084 A | 7/1979 | Tsai |

(Continued)

FOREIGN PATENT DOCUMENTS

| JP | 2003-073889 A | * | 3/2003 |
| WO | 99/53119 A | | 10/1999 |

(Continued)

OTHER PUBLICATIONS

Baskaran, R., and T. Ritzdorf, "Direct on Barrier Copper Deposition," Proceedings of Advanced Metallization Conference (ACM-2004), San Diego, Oct. 20, 2004, 12 pages.

(Continued)

*Primary Examiner* — Harry D Wilkins, III
(74) *Attorney, Agent, or Firm* — Christensen O'Connor Johnson Kindness PLLC

(57) ABSTRACT

Processes and systems for electrolytically processing a microfeature workpiece with a first processing fluid and a counter electrode are described. Microfeature workpieces are electrolytically processed using a first processing fluid, a counter electrode, a second processing fluid, and an anion permeable barrier layer. The anion permeable barrier layer separates the first processing fluid from the second processing fluid while allowing certain anionic species to transfer between the two fluids. Some of the described processes produce deposits over repeated plating cycles that exhibit resistivity values within desired ranges.

25 Claims, 9 Drawing Sheets

Related U.S. Application Data continuation of application No. 11/299,293, filed on Dec. 8, 2005, now abandoned, which is a continuation-in-part of application No. 11/296,574, filed on Dec. 7, 2005, now abandoned, which is a continuation-in-part of application No. 10/861,899, filed on Jun. 3, 2004, now Pat. No. 7,585,398, which is a continuation-in-part of application No. 09/872,151, filed on May 31, 2001, now Pat. No. 7,264,698, which is a continuation-in-part of application No. 09/804,697, filed on Mar. 12, 2001, now Pat. No. 6,660,137, which is a continuation of application No. PCT/US00/10120, filed on Apr. 13, 2000, said application No. 11/416,659 is a continuation-in-part of application No. 10/729,357, filed on Dec. 5, 2003, now Pat. No. 7,351,315, and a continuation-in-part of application No. 10/729,349, filed on Dec. 5, 2003, now Pat. No. 7,351,314, and a continuation-in-part of application No. 10/059,907, filed on Jan. 29, 2002, now abandoned, which is a division of application No. 09/531,828, filed on Mar. 21, 2000, now Pat. No. 6,368,475.

(60) Provisional application No. 60/129,055, filed on Apr. 13, 1999.

(51) Int. Cl.
  *H01L 21/288* (2006.01)
  *H01L 21/768* (2006.01)
  *C25D 17/00* (2006.01)
  *C25F 3/02* (2006.01)
  *C25D 5/02* (2006.01)
  *C25D 3/38* (2006.01)
  *H05K 3/42* (2006.01)

(56) References Cited

U.S. PATENT DOCUMENTS

| | | | |
|---|---|---|---|
| 4,323,435 A | 4/1982 | Carlin | |
| 4,574,095 A | 3/1986 | Baum | |
| 4,778,572 A | 10/1988 | Brown | |
| 4,933,052 A | 6/1990 | O'Brien | |
| 4,950,368 A | 8/1990 | Weinberg | |
| 4,975,159 A | 12/1990 | Dahms | |
| 5,009,714 A | 4/1991 | Arrington | |
| 5,082,538 A | 1/1992 | DeRespiris | |
| 5,114,544 A | 5/1992 | Forsyth | |
| 5,151,168 A | 9/1992 | Gilton | |
| 5,162,079 A | 11/1992 | Brown | |
| 5,164,332 A | 11/1992 | Kumar | |
| 5,215,631 A | 6/1993 | Westfall | |
| 5,243,222 A | 9/1993 | Harper | |
| 5,256,274 A | 10/1993 | Poris | |
| 5,358,907 A | 10/1994 | Wong | |
| 5,478,445 A | 12/1995 | Barker | |
| 5,533,971 A | 7/1996 | Phipps | |
| 5,800,858 A | 9/1998 | Bickford | |
| 5,882,498 A | 3/1999 | Dubin | |
| 5,883,762 A | 3/1999 | Calhoun | |
| 5,891,513 A | 4/1999 | Dubin | |
| 6,197,181 B1 | 3/2001 | Chen | |
| 6,227,263 B1 | 5/2001 | Kust | |
| 6,277,263 B1 | 8/2001 | Chen | |
| 6,290,833 B1 | 9/2001 | Chen | |
| 6,300,244 B1 | 10/2001 | Itabashi | |
| 6,319,387 B1 | 11/2001 | Krishnamoorthy | |
| 6,368,475 B1 | 4/2002 | Hanson | |
| 6,368,966 B1 | 4/2002 | Krishnamoorthy | |
| 6,413,864 B1 | 7/2002 | Pyo | |
| 6,472,023 B1 | 10/2002 | Wu | |
| 6,485,542 B2 | 11/2002 | Shindo | |
| 6,494,219 B1 | 12/2002 | Nayak | |
| 6,515,368 B1 | 2/2003 | Lopatin | |
| 6,527,920 B1* | 3/2003 | Mayer et al. | 204/237 |
| 6,531,046 B2 | 3/2003 | Morrissey | |
| 6,565,729 B2 | 5/2003 | Chen | |
| 6,602,394 B1 | 8/2003 | Hillebrand | |
| 6,660,137 B2 | 12/2003 | Wilson | |
| 6,755,960 B1 | 6/2004 | Frischauf | |
| 6,811,675 B2 | 11/2004 | Chen | |
| 7,387,964 B2 | 6/2008 | So | |
| 2002/0032499 A1 | 3/2002 | Wilson | |
| 2002/0130046 A1 | 9/2002 | Cheung | |
| 2003/0127337 A1 | 7/2003 | Hanson | |
| 2004/0000491 A1 | 1/2004 | Kovarsky | |
| 2004/0016636 A1 | 1/2004 | Yang | |
| 2004/0065543 A1 | 4/2004 | Kovarsky | |
| 2004/0072419 A1 | 4/2004 | Baskaran | |
| 2004/0118694 A1 | 6/2004 | Yang | |
| 2005/0006245 A1 | 1/2005 | Sun | |
| 2005/0081744 A1 | 4/2005 | Klocke | |
| 2005/0087439 A1* | 4/2005 | Hanson et al. | 204/263 |
| 2005/0121317 A1 | 6/2005 | Klocke | |
| 2005/0121326 A1 | 6/2005 | Klocke | |
| 2005/0189231 A1* | 9/2005 | Capper et al. | 205/246 |
| 2006/0096867 A1* | 5/2006 | Bokisa et al. | 205/253 |
| 2006/0260952 A1 | 11/2006 | Mazur | |

FOREIGN PATENT DOCUMENTS

| | | |
|---|---|---|
| WO | 00/05747 A | 2/2000 |
| WO | 2004/108995 A1 | 12/2004 |

OTHER PUBLICATIONS

Beaudry, C.L, and J.O. Dukovic, "Faraday in the Fab: A Look at Copper Plating Equipment for On-Chip Wiring," The Electrochemical Society Interface 13(4):40-44, Winter 2004.

Sun, Z.-W., et al., "Direct Plating of Cu on Ru: Nucleation Kinetics and Gap Fill Chemistry," Proceedings of Advanced Metallization Conference (ACM-2004), San Diego, Oct. 19-21, 2004, pp. 1-16.

Office Action mailed Sep. 21, 2007, from U.S. Appl. No. 11/414,535, filed Apr. 28, 2006, 25 pages.

Office Action mailed Jul. 23, 2010, from U.S. Appl. No. 11/414,145, filed Apr. 28, 2006, 16 pages.

Amendment After Non-Final Rejection filed Jan. 24, 2011, from U.S. Appl. No. 11/414,145, filed Apr. 28, 2006, 12 pages.

Final Office Action mailed Apr. 25, 2011, from U.S. Appl. No. 11/414,145, filed Apr. 28, 2006, 10 pages.

Amendment Submitted with Request for Continued Examination filed Oct. 25, 2011, from U.S. Appl. No. 11/414,145, filed Apr. 28, 2006, 15 pages.

Notice of Allowance/Notice of Allowability mailed Jun. 1, 2012, from U.S. Appl. No. 11/414,145, filed Apr. 28, 2006, 5 pages.

Supplemental Notice of Allowability mailed Jun. 1, 2012, from U.S. Appl. No. 11/414,145, filed Apr. 28, 2006, 5 pages.

* cited by examiner

ELECTROLYTIC PROCESS USING ANION PERMEABLE BARRIER

CROSS-REFERENCES TO RELATED APPLICATIONS

This application is a continuation of application Ser. No. 11/416,659, filed May 3, 2006, to be issued as U.S. Pat. No. 8,123,926, on Feb. 28, 2012, which is a continuation of application Ser. No. 11/299,293, filed Dec. 8, 2005, now abandoned, which is a continuation-in-part of application Ser. No. 11/296,574, filed Dec. 7, 2005, now abandoned, which is a continuation-in-part of application Ser. No. 10/861,899, filed Jun. 3, 2004, now U.S. Pat. No. 7,585,398, which is a continuation-in-part of application Ser. No. 09/872,151, filed May 31, 2001, now U.S. Pat. No. 7,264,698, which is a continuation-in-part of application Ser. No. 09/804,697 filed Mar. 12, 2001, now U.S. Pat. No. 6,660,137, which is a continuation of Application No. PCT/US/00/10120, filed Apr. 13, 2000, which claims the benefit of Provisional Application No. 60/129,055, filed Apr. 13, 1999, the disclosures of which are hereby incorporated by reference herein.

Application Ser. No. 11/416,659, filed May 3, 2006, is also a continuation-in-part of application Ser. No. 10/729,357, filed Dec. 5, 2003, now U.S. Pat. No. 7,351,315, and is a continuation-in-part of application Ser. No. 10/729,349, filed Dec. 5, 2003, now U.S. Pat. No. 7,351,314, and is a continuation-in-part of application Ser. No. 10/059,907, filed Jan. 29, 2002, now abandoned, which is a division of application Ser. No. 09/531,828, filed Mar. 21, 2000, now U.S. Pat. No. 6,368,475, the disclosures of which are hereby incorporated by reference herein.

BACKGROUND

Embodiments of the present disclosure relate to electrolytic processing of microfeature workpieces and an electrolytic treatment process that utilizes an anion permeable barrier.

Microfeature devices, such as semiconductor devices, imagers, displays, thin film heads, micromechanical components, microelectromechanical systems (MEMS), and large through-wafers vias are generally fabricated on and/or in microfeature workpieces using a number of machines that deposit and/or etch materials from the workpieces. Many current microfeature devices require interconnects and other very small, submicron sized features (e.g., 45-250 nanometers) formed by depositing materials into small trenches or holes. One particularly useful process for depositing materials into small trenches and/or vias is electrolytic processing, e.g., electroplating. Typical electrolytic processing techniques include electroplating processes that deposit copper, nickel, lead, gold, silver, tin, platinum, and other materials onto microfeature workpieces and etching processes that remove metals from microfeature workpiece surfaces.

In certain electroplating or etching processes, chelants or complexing agents are used to affect the electric potential at which metal ions are deposited onto or removed from surfaces of microfeature workpieces. Other components that may be present in the processing fluids include accelerators, suppressors, and levelers which can affect the results of the electroplating or electroetching process. Although these types of materials can positively influence the electroplating or electroetching processes, their use is not without drawbacks. For example, it is possible for these components to have an adverse impact on the electrolytic process as a result of reactions or other interactions with electrodes used in the electrolytic process.

Another challenge in depositing metals into narrow, deep trenches or vias is that it is difficult to completely fill the small features without creating voids or other nonuniformities in the deposited metal. For example, when depositing metal into a trench having a critical dimension of 45 nanometers to 250 nanometers, an ultrathin seed layer may be used, but care must be taken to ensure sufficient vacant space in the trench for the subsequently deposited bulk metal. In addition, ultrathin seed layers may be problematic because the quality of the deposited seed layer may not be uniform. For example, ultrathin seed layers may have voids or other nonuniform physical properties that can result in nonuniformities in the material deposited onto the seed layer. Such challenges may be overcome by enhancing the seed layers or forming a seed layer directly on a barrier layer to provide competent seed layers that are well suited for depositing metals into trenches or holes with small critical dimensions. One technique for enhancing the seed layer or forming a seed layer directly on a barrier layer is to electroplate a material using a processing solution with a low conductivity. Such low conductivity processing fluids have relatively low hydrogen ion ($H^+$) concentrations, i.e., relatively high pH. Suitable electrochemical processes for forming competent seed layers using low conductivity processing fluids are disclosed in U.S. Pat. No. 6,197,181, which is herein incorporated by reference.

Electroplating onto seed layers or electroplating materials directly onto barrier layers using low conductivity/high pH processing fluids presents additional challenges. For example, inert anodes are generally required when high pH processing fluids are used because the high pH tends to passivate consumable anodes. Such passivation may produce metal hydroxide particles and/or flakes that can create defects in the microfeatures. Use of inert anodes is not without its drawbacks. The present inventors have observed that when inert anodes are used, the resistivity of the deposited material increases significantly over a relatively small number of plating cycles. One way to combat this increase in the resistivity of the deposited material is to frequently change the processing fluid; however, this solution increases the operating cost of the process.

As a result, there is a need for electrolytic processes for treating microfeature workpieces that reduce adverse impacts created by the presence of complexing agents and/or other additives and also maintain deposit resistivity within desired ranges.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The embodiments described herein relate to processes for electrolytically processing a microfeature workpiece to deposit one or more cations or to remove cations from surfaces of microfeature workpieces. In certain embodiments, the processes are capable of producing deposits that exhibit resistivity values within desired ranges over an extended number of plating cycles. The embodiments described herein also relate to processes that reduce the adverse impacts created by the presence of complexing agents and/or other additives in processing fluids used to electrolytically process a microfeature workpiece. In some embodiments, the described processes employ low conductivity/high pH processing fluids without suffering from the drawback of defect formation in the deposited material resulting from the presence of metal hydroxide particles or flakes present in processing fluids in contact with the microfeature workpiece. Processors of microfeature workpieces will find certain processes described herein desirable because the processes produce high yields of deposits that exhibit resistivity values within acceptable ranges without requiring costly frequent replacement of processing fluids. Reducing adverse impacts created by the presence of complexing agents and/or other additives in the processing fluids may also be considered desirable by users of the electrolytic processes described herein.

In one embodiment of the present disclosure, a process for electrolytically processing a microfeature workpiece as the working electrode with a first processing fluid and a counter electrode is provided. The process generally includes contacting a surface of the microfeature workpiece with the first processing fluid, the first processing fluid comprising first processing fluid species including one or more cations, an anion, and a complexing agent. The process further includes contacting the counter electrode with a second processing fluid, and producing an electrochemical reaction at the counter electrode. The process further includes providing an anion permeable barrier between the first processing fluid and the second processing fluid to substantially prevent movement of cationic species and the complexing agent between the first processing fluid and the second processing fluid.

In another embodiment of the present disclosure, a process for electrolytically processing a microfeature workpiece as the working electrode with a first processing fluid and a counter electrode is provided. The process generally includes contacting a surface of the microfeature workpiece with the first processing fluid, the first processing fluid comprising first processing fluid species including one or more cations, an anion, and a complexing agent. The process further includes contacting the counter electrode with a second processing fluid and producing an electrochemical reaction at the counter electrode. The process further includes substantially preventing the movement of the cationic species and the complexing agent between the first processing fluid and the second processing fluid.

In yet another embodiment of the present disclosure, a process for electrolytically processing a microfeature workpiece as the working electrode with a first processing fluid and a counter electrode is provided. The process generally includes contacting a surface of the microfeature workpiece with the first processing fluid, the first processing fluid comprising first processing fluid species including a cation selected from the group consisting of copper ion, gold ion, tin ion, silver ion, platinum ion, ruthenium ion, rhodium ion, iridium ion, osmium ion, rhenium ion, palladium ion, and nickel ion, an anion, and a complexing agent. The process further includes contacting the counter electrode with a second processing fluid, wherein the second processing fluid includes no cation or a lower concentration of cation than the first processing fluid, and producing an electrochemical reaction at the counter electrode. The process further includes substantially preventing the movement of the cationic species and the complexing agent between the first processing fluid and the second processing fluid species.

Embodiments of the present disclosure can be carried out in a system for electrolytically processing a microfeature workpiece. The system includes a chamber that has a processing unit for receiving a first processing fluid and counter electrode unit for receiving a second processing fluid. A counter electrode is located in the counter electrode unit, and an anion permeable barrier is located between the processing unit and the counter electrode unit. The chamber further includes a source of one or more cations in fluid communication with the processing unit.

The process and system embodiments described above can be used to electroplate materials onto a surface of a microfeature workpiece or used to electroetch or deplate materials from a surface of a microfeature workpiece. When the process is used to electroplate materials, the microfeature workpiece will function as a cathode, and the counter electrode will function as an anode. In contrast, when deplating is carried out, the microfeature workpiece will function as an anode, and the counter electrode will function as a cathode. Systems for deplating are also within the scope of the present disclosure.

DESCRIPTION OF THE DRAWINGS

The foregoing aspects and many of the attendant advantages of this disclosure will become more readily appreciated as the same become better understood by reference to the following detailed description, when taken in conjunction with the accompanying drawings, wherein.

DETAILED DESCRIPTION

As used herein, the terms "microfeature workpiece" or "workpiece" refer to substrates on and/or in which micro devices are formed. Such substrates include semiconductive substrates (e.g., silicon wafers and gallium arsenide wafers), nonconductive substrates (e.g., ceramic or glass substrates), and conductive substrates (e.g., doped wafers). Examples of micro devices include microelectronic circuits or components, micromechanical devices, microelectromechanical devices, micro optics, thin film recording heads, data storage elements, microfluidic devices, and other small scale devices.

In the description that follows regarding electroplating a metal onto a microfeature workpiece, specific reference is made to copper as an example of a metal ion that can be electroplated onto a microfeature workpiece. The reference to copper ions is for exemplary purposes, and it should be understood that the following description is not limited to copper ions. Examples of other metal ions useful in the processes described herein include gold ions, tin ions, silver ions, platinum ions, lead ions, cobalt ions, zinc ions, nickel ions, ruthenium ions, rhodium ions, iridium ions, osmium ions, rhenium ions, and palladium ions.

In the description that follows regarding electroplating more than one metal onto a microfeature workpiece, specific reference is made to a tin-silver solder system as an example of metal ions that can be electroplated onto a microfeature workpiece to form a composite deposit. The reference to deposition of a tin-silver solder is for exemplary purposes, and it should be understood that the description is not limited to tin and silver ions.

With respect to the description that follows regarding deplating a metal from a microfeature workpiece, specific reference is made to copper as an example of a metal ion that can be deplated from a microfeature workpiece. The reference to copper is for exemplary purposes, and it should be understood that the description regarding deplating are not limited to the removal of copper. Examples of other metals that can be removed from a microfeature workpiece in accordance with embodiments described herein include gold ions, tin ions, silver ions, platinum ions, lead ions, cobalt ions, zinc ions, nickel ions, ruthenium ions, rhodium ions, iridium ions, osmium ions, rhenium ions, and palladium ions.

Figure 1:
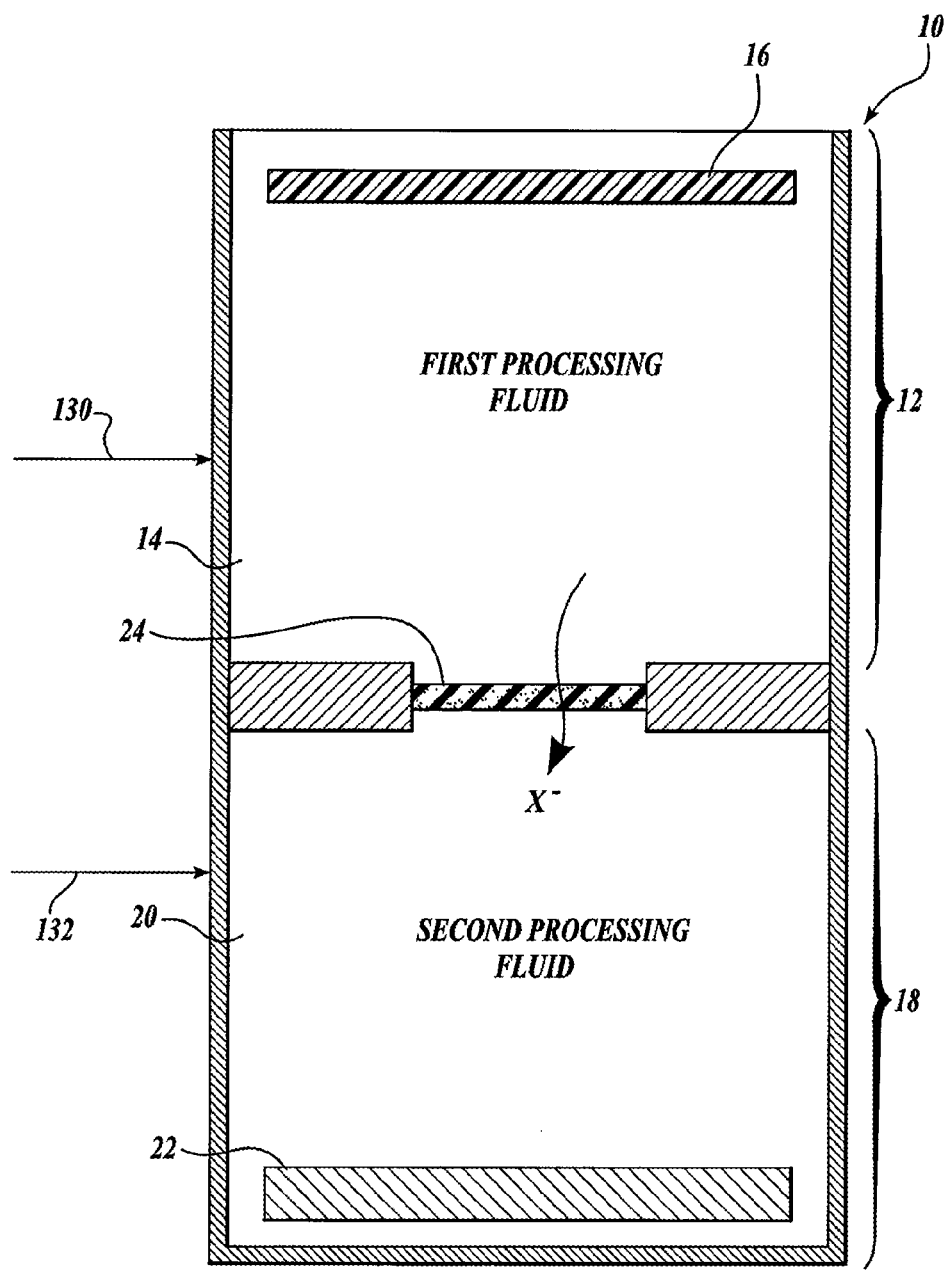
FIG. 1 is a schematic illustration of a reactor for carrying out processes described herein.

Processes described herein can be carried out in an electrochemical reactor, e.g., an electroplating or deplating reactor, such as the one described below with reference to FIG. 1. Referring to FIG. 1, reactor 10 includes an upper processing unit 12 containing a first processing fluid 14 (e.g., a catholyte in an electroplating process or an anolyte in a deplating process) and a counter electrode unit 18 below the processing unit 12 that contains a second processing fluid 20 (e.g., anolyte in an electroplating process or a catholyte in a deplating process) which may be different in composition and/or properties from the first processing fluid 14. Processing unit 12 receives a working electrode 16 (e.g., a microfeature workpiece) and delivers first processing fluid 14 to the working electrode 16. Counter electrode unit 18 includes a counter electrode 22 that is in contact with the second processing fluid 20. When copper is to be deposited onto working electrode 16, working electrode 16 is the cathode and counter electrode 22 is the anode. Accordingly, in plating applications, first processing fluid 14 is a catholyte, and second processing fluid 20 is an anolyte. In general, the catholyte contains components in the form of ionic species, such as acid ions, hydroxyl ions, and metal ions, and a complexing agent capable of forming a complex with the metal ions. The catholyte may also include organic components, such as accelerators, suppressors, and levelers that improve the results of the electroplating process. In addition, the catholyte may include a pH adjustment agent to affect the pH of the catholyte. The anolyte generally includes ionic species as well, such as acid ions, hydroxyl ions, and metal ions. The catholyte may also include a pH adjustment agent. Additional details regarding the various components in the catholyte and anolyte are provided below.

When copper is to be deplated from working electrode 16, working electrode 16 is the anode, and counter electrode 22 is the cathode. Accordingly, in deplating applications, the first processing fluid 14 is an anolyte, and the second processing fluid 20 is a catholyte.

Reactor 10 also includes a nonporous anion permeable barrier 24 between the first processing fluid 14 and the second processing fluid 20. Nonporous anion permeable barrier 24 allows anions to pass through the barrier while inhibiting or substantially preventing non-anionic components, such as cations, from passing between the first processing fluid 14 and second processing fluid 20. By inhibiting or substantially preventing nonionic components from passing between the first processing fluid 14 and second processing fluid 20, adverse effects on the deposited material resulting from the presence of unwanted nonanionic components, such as cations, in the first processing fluid 14 can be avoided. As such, nonporous anion permeable bather 24 separates first processing fluid 14 and second processing fluid 20 such that first processing fluid 14 can have different chemical characteristics and properties than second processing fluid 20. For example, the chemical components of first processing fluid 14 and second processing fluid 20 can be different, the pH of first processing fluid 14 and second processing fluid 20 can be different, and concentrations of components common to both first processing fluid 14 and second processing fluid 20 can be different.

In the following description of an electroplating process, for consistency, working electrode 16 will be referred to as the cathode, and counter electrode 22 will be referred to as the anode. Likewise, first processing fluid 14 will be referred to as the catholyte, and second processing fluid 20 will be referred to as the anolyte. When reactor 10 is used to electrolytically process a microfeature workpiece to deposit metal ions thereon, an electric potential is applied between anode 22 and cathode 16. Copper ions in the catholyte are consumed by the deposition of copper ions onto the cathode. Meanwhile, the anode becomes positively charged and attracts negatively charged ions to its surface. For example, hydroxyl ions in the anolyte are attracted to the anode where they react to liberate oxygen and produce water. The foregoing results in a gradient of charge in the anolyte with unbalanced positively charged species in the anolyte solution, and negatively charged species in the catholyte solution. This charge imbalance encourages the transfer of negatively charged anions through the anion permeable barrier 24 from catholyte 14 to the anolyte 20. An electrochemical reaction (e.g., losing or gaining electrons) occurs at cathode 16, resulting in metal ions being reduced (i.e., gaining electrons) to metal on surfaces of cathode 16.

Reactor 10 effectively maintains the concentration of metal ions in catholyte 14 during the electroplating process in the following manner. As metal ions are deposited onto the surface of cathode 16, additional metal ions are introduced to catholyte 14 from a source of metal ions 130, which is in fluid communication with processing unit 12. As explained below in more detail, these metal ions can be provided by delivering a metal salt solution to processing unit 12. Processing unit 12 can also be in fluid communication with sources of other components that need replenishment. In a similar fashion, counter electrode unit 18 may be in fluid communication with sources of components that require replenishment. For example, counter electrode unit 18 can be in fluid communication with a source of pH adjustment agent 132. Likewise, both processing unit 12 and electrode unit 18 can include conduits or other structures for removing portions of catholyte 14 from processing unit 12 or portions of anolyte 20 from counter electrode unit 18.

Anode 22 may be a consumable anode or an inert anode. Exemplary consumable anodes and inert anodes are described below in more detail.

Figure 4:
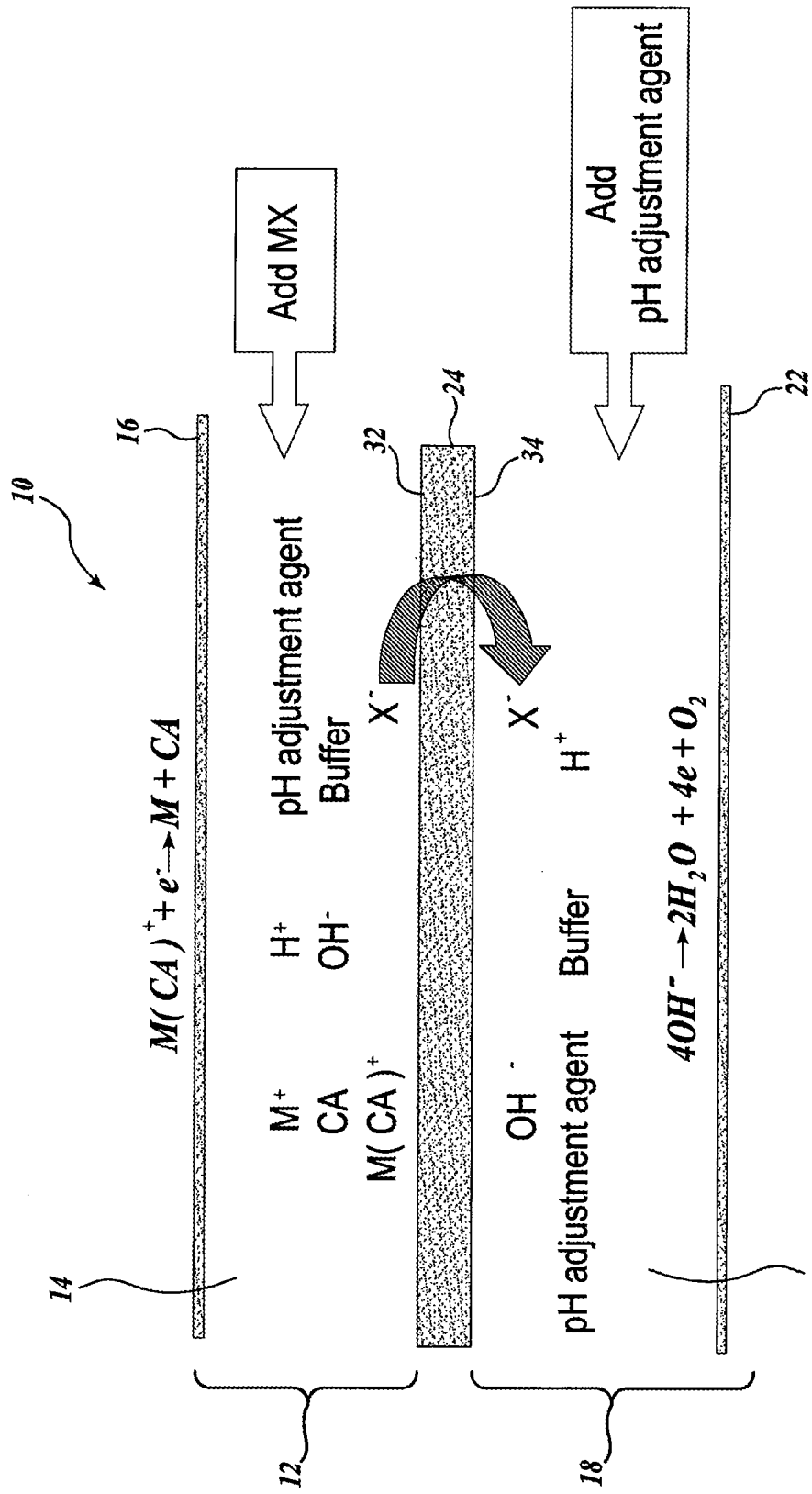
FIG. 4 is a schematic illustration of the chemistry and chemical reactions occurring in one embodiment of the processes for electroplating a metal described herein.

Referring to FIG. 4, the chemistry present in processing unit 12 and counter electrode unit 18 are described in more detail along with various chemical reactions that are believed to occur. It should be understood that by describing chemical reactions that are believed to occur within reactor 10, the processes described herein are not limited to processes wherein these reactions occur.

FIG. 4 schematically illustrates an example of the operation of reactor 10 using an anion permeable bather 24 and an inert anode 22 in combination with a low conductivity/high pH first processing fluid and a low conductivity/high pH second processing fluid suitable for processing copper seed layers or plating directly onto a barrier layer. In the description that follows, high pH first processing fluid 14 in processing unit 12 is a catholyte containing a metal ion ($M^+$), e.g., copper ions ($Cu^{2+}$), a counter ion ($X^-$) for the metal ion, e.g., sulfate ions ($SO_4^{2-}$), a complexing agent CA, as described below, chelated with the metal ions, a pH buffer such as boric acid ($H_3BO_3$) that dissociates into hydrogen ions ($H^+$) and $H_2BO_3^-$, and a pH adjustment agent, such as tetramethylammonium hydroxide (TMAH) that dissociates into hydroxyl ion ($OH^-$) and $TMA^+$. The specific hydrogen ion concentration in catholyte 14 can be chosen taking into consideration conventional factors such as complexing ability of the complexing agent, buffering capability of the buffer, metal ion concentrations, volatile organics concentrations, deposition potential of the complex at the particular pH, solubility of the catholyte constituents, stability of the catholyte, desired characteristics of the deposits, and diffusion coefficients of the metal ions.

For example, for electroplating embodiments, high pH second processing fluid 20 in counter electrode unit 18 is an anolyte. Anolyte 20 can have a concentration of $H^+$ that is approximately equal to the concentration of $H^+$ in catholyte 14, although this is not required. By adjusting $H^+$ concentration in anolyte 20 to be approximately equal to the concentration of $H^+$ in catholyte 14, transfer of negatively charged hydroxyl ions from catholyte 14 to anolyte 20 through anion permeable membrane 24 during electroplating is inhibited. By inhibiting the transfer of negatively charged hydroxyl ions from catholyte 14 to anolyte 20, a more constant catholyte pH can be maintained. By maintaining pH of the catholyte relatively constant, the need to add pH adjustment agent to the catholyte is reduced or eliminated. This simplifies maintenance of the catholyte and helps to maintain the conductivity of the catholyte relatively stable through repeated plating cycles. In the description that follows with reference to FIG. 4, anolyte 20 includes a pH adjustment agent, such as TMAH, and a buffer, such as boric acid.

As mentioned above, during a plating cycle, an electric potential is applied between cathode 16 and anode 22. As copper ions are reduced and electroplated onto cathode 16, sulfate ions ($SO_4^{2-}$) accumulate in the catholyte near a first surface 32 of anion permeable bather 24. Additionally, depending on the pH of the anolyte at positively charged anode 22, hydroxyl ions ($OH^-$) are converted to water ($H_2O$) and oxygen ($O_2$) and/or water is decomposed to hydrogen ions ($H^+$) and oxygen. The resulting electrical charge gradient causes the negatively charged sulfate ions to move from first surface 32 of anion permeable barrier 24 to the second surface 34 of anion permeable barrier 24. The transfer of negatively charged sulfate ions from catholyte 14 to anolyte 20 during the plating cycle maintains the charge balance of reactor 10. To maintain the concentration of the negatively charged ions resulting from the dissociation of boric acid in catholyte 14 during electroplating, the concentration of boric acid in the anolyte may be set so it is significantly greater than the concentration of boric acid in the catholyte. This concentration differential inhibits the negatively charged ions resulting from the dissociation of boric acid in catholyte 14 from moving through anion permeable membrane 24 to anolyte 20 during electroplating.

Continuing to refer to FIG. 4, during a plating cycle, as explained above, copper ions in catholyte 14 are reduced at cathode 16 and are deposited as copper. Copper ions that are consumed by the electroplating are replenished by the addition of a solution of copper sulfate to the catholyte. During the plating cycle, sulfate ions which are introduced to catholyte 14 as a result of adding the copper sulfate transfer across anion permeable bather 24 to anolyte 20. Portions of the anolyte can be removed from counter electrode unit (18 in FIG. 1) in order to avoid the excessive build up of sulfate ions in the anolyte 20. Non-anionic components in catholyte 14 (e.g., $Cu^{2+}$, $H^+$, $TMA^+$, $H_3BO_3$, and $Cu(ED)_2^{2+}$) generally do not pass through anion permeable membrane 24 and thus remain in catholyte 14. As described above, transfer of the hydroxyl ($OH^-$) ion from the catholyte to the anolyte is minimized by maintaining pH of anolyte 20 at substantially the same level as pH of catholyte 14. Since hydroxyl ions are consumed at anode 22, a pH adjustment agent, such as TMAOH, may be added to anolyte 20 as described above to maintain the pH of the anolyte at desired levels.

Figure 9A:
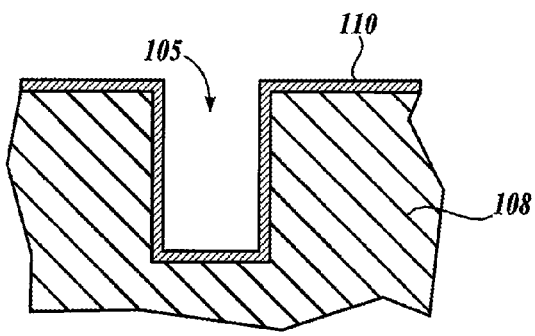
FIGS. 9A-9C are schematic illustrations of one embodiment of the processes described herein for electrolytically treating a seed layer.
Figure 9B:
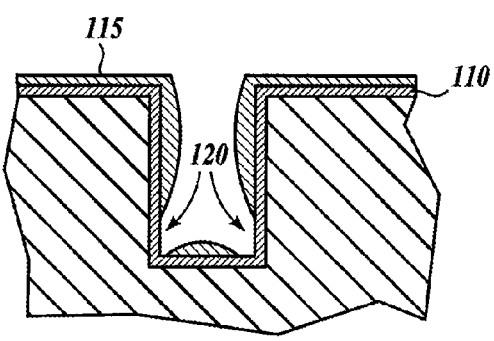
Figure 9C:
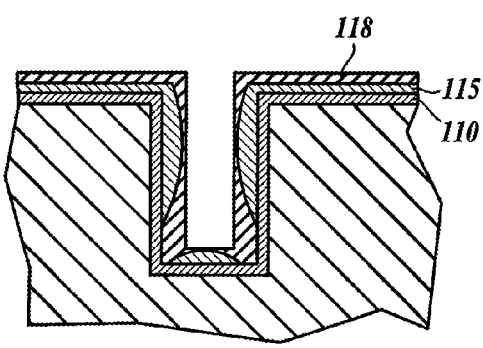

Microfeature workpieces that can be processed using processes described herein can include different structures on their surfaces that can be electrolytically processed to deposit materials thereon. For example, a semiconductor microfeature workpiece can include seed layers or barrier layers. Referring to FIGS. 9A-9C, one sequence of steps for electrolytically processing a seed layer using a process described herein is provided.

Referring to FIG. 9A, a cross-sectional view of a microstructure, such as trench 105 that is to be filled with bulk metallization is illustrated and will be used to describe use of processes described herein to enhance a seed layer. As shown, a thin barrier layer 110, for example, titanium nitride or tantalum nitride, is deposited over the surface of a semiconductor device or, as illustrated in FIG. 9A, over a layer of dielectric 108 such as silicon dioxide. Any known technique such as chemical vapor deposition (CVD) or physical vapor deposition (PVD), can be used to deposit barrier layer 110.

After deposition of barrier layer 110, an ultrathin copper seed layer 115 is deposited on barrier layer 110. The resulting structure is illustrated in FIG. 9B. Seed layer 115 can be formed using a vapor deposition technique also, such as CVD or PVD. Alternatively, seed layer 115 can be formed by direct electroplating onto barrier layer 110 as described below in more detail. Owing to the small dimensions of trench 105, techniques used to form ultrathin seed layer 115 should be capable of forming the seed layer without closing off small geometry trenches. In order to avoid closing off small geometry trenches, seed layer 115 should be as thin as possible while still providing a suitable substrate upon which to deposit bulk metal. For example, ultrathin seed layer 115 can have a thickness of about 50 to about 500 angstroms, about 100 to about 250 angstroms, or specifically about 200 angstroms.

The use of ultrathin seed layer 115 introduces its own set of drawbacks. For example, ultrathin seed layers may not coat the barrier layer in a uniform manner. For example, voids or non-continuous seed layer regions on the sidewalls of the trenches such as at 120, can be present in ultrathin seed layer 115. The processes described herein can be used to enhance seed layer 115 to fill the void or non-continuous regions 120 found in ultrathin seed layer 115. Referring to FIG. 9C, to achieve this enhancement, the microfeature workpiece is processed as described herein to deposit a further amount of metal 118 onto ultrathin seed layer 115 and/or portions of underlying barrier layer 110 that are exposed at voids or non-continuous portions 120.

Preferably, this seed layer enhancement continues until a sidewall step coverage, i.e., the ratio of seed layer 115 thickness at the bottom sidewall regions to the nominal thickness of seed layer 115 at the exteriorly disposed side of the workpiece, achieves a value of at least 10%. More preferably, the sidewall step coverage is at least about 20%. Preferably, such sidewall step coverage values are present in substantially all of the recessed structures of the microfeature workpiece; however, it will be recognized that certain recessed structures may not reach such sidewall step values.

Figure 10A:
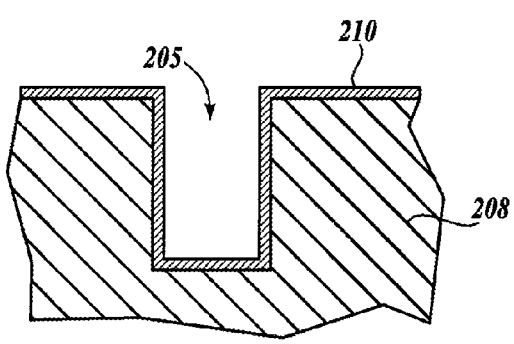
FIGS. 10A and 10B are schematic illustrations of one embodiment of the processes described herein for electrolytically treating a barrier layer.
Figure 10B:
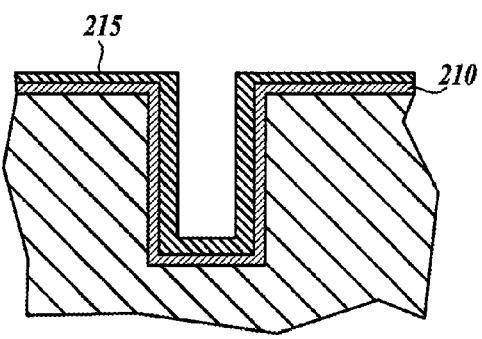

Another type of feature on the surface of a microfeature workpiece that can be electrolytically treated using processes described herein is a barrier layer. Barrier layers are used because of the tendency of certain metals to diffuse into silicon junctions and alter the electrical characteristics of semiconductor devices formed in a substrate. Barrier layers made of materials such as titanium, titanium nitride, tantalum, tantalum nitride, tungsten, and tungsten nitride are often laid over silicon junctions and any intervening layers prior to depositing a layer of metal. Referring to FIG. 10A, a cross-sectional view of a microstructure, such as trench 205 that is to be filled with bulk metallization is illustrated, and will be used to describe the formation of a metal layer directly onto a barrier layer using processes described herein. As illustrated in FIG. 10A, thin barrier layer 210 is deposited over the surface of a semiconductor device or, as illustrated in FIG. 10A, over a layer of dielectric 208, such as silicon dioxide. Barrier layer 210 can be deposited as described above with reference to FIG. 9A using CVD or PVD techniques. After barrier layer 210 is deposited, the microfeature workpiece is processed as described herein to form a metal feature 215 over barrier layer 210. The resulting structure can then be further processed to deposit bulk metal (not shown) to fill the trench 205.

The pH of processing fluids described herein can vary from alkaline to acidic. The low conductivity/high pH processing fluids described herein are distinct from low pH processing fluids such as acidic electroplating baths. The concentration of $H^+$ useful in high pH processing fluids may vary with those providing pHs above 7, preferably above 8 and most preferably above 9 being examples of useful high pH processing fluids.

As noted above, processes described herein are useful to electroplate metals other than copper, for example, gold, silver, platinum, nickel, tin, lead, ruthenium, rhodium, iridium, osmium, rhenium, and palladium. Metal ions useful in the catholyte can be provided from a solution of a metal salt. Exemplary metal salts include gluconates, cyanides, sulfamates, citrates, fluoroborates, pyrophosphates, sulfates, chlorides, sulfides, chlorites, sulfites, nitrates, nitrites, and methane sulfonates. Exemplary concentrations of metal salts in the catholyte used for plating applications range from about 0.03 to about 0.25M.

The ability to electroplate metal ions can be affected by chelating the metal ion with a complexing agent. In the context of the electroplating of copper, copper ions chelated with ethylene diamine complexing agent exhibit a higher deposition potential compared to copper ions that have not been chelated. Complexing agents useful for chelating and forming complexes with metal ions include chemical compounds having at least one part with the chemical structure $COOR_1$—$COHR_2R_3$ where $R_1$ is an organic group covalently bound to the carboxylate group (COO), $R_2$ is either hydrogen or an organic group, and $R_3$ is either hydrogen or an organic group. Specific examples of such type of complexing agents include citric acid and salts thereof, tartaric acid and salts thereof, diethyltartrate, diisoproyltartrate, and dimethyltartrate. Another type of useful complexing agent includes compounds that contain a nitrogen containing chelating group $R$—$NR_2$—$R_1$, wherein R is any alkyl or aromatic group, and $R_1$ and $R_2$ are H, alkyl, or aryl organic groups or polymer chains. Specific examples of these types of complexing agents include ethylene diamine, ethylene diamine tetraacetic acid and its salts, cyclam, porphrin, bipyridyl, pyrolle, thiophene, and polyamines. In plating embodiments, suitable ratios between the concentration of metal ions and concentrations of complexing agents in the catholyte can range from 1:25 to 25:1; for example, 1:10 to 10:1 or 1:5 to 5:1.

Useful pH adjustment agents include materials capable of adjusting the pH of the first processing fluid and the second processing fluid, for example, to above 7 to about 13, and more specifically, above about 9.0. When ethylene diamine or citric acid are used as a complexing agent for copper ions, a pH of about 9.5 is useful. When ethylene diamine tetraacetic acid is used as a complexing agent for copper ions, a pH of about 12.5 is suitable. Examples of suitable pH adjustment agents include alkaline agents such as potassium hydroxide, ammonium hydroxide, tetramethyl ammonium hydroxide, sodium hydroxide, and other alkaline metal hydroxides. A useful amount and concentration of pH adjustment agents will depend upon the level of pH adjustment desired and other factors, such as the volume of processing fluid and the other components in the processing fluid. Useful pH adjustment agents also include materials capable of adjusting the pH of the first and second processing fluid to below 7.

Useful buffers include materials that maintain the pH relatively constant, preferably at a level that facilitates complex formation and desirable complexed species. Boric acid was described above as an example of a suitable buffer. Other useful buffers include sodium acetate/acetic acid and phosphates. Exemplary concentrations of buffer range from about 0.01 to about 0.5M in the catholyte for plating applications.

The catholyte can include other additives such as those that lower the resistivity of the fluid, e.g., ammonium sulfate; and those that increase the conformality of the deposit, e.g., ethylene glycol. For plating applications, exemplary concentrations of resistivity effecting agents in the catholyte range from about 0.01 to about 0.5M. For conformality affecting agents, concentrations ranging from about 0 to 1.0M are exemplary.

Useful anion permeable barriers include nonporous barriers, such as semi-permeable anion exchange membranes. A semi-permeable anion exchange membrane allows anions to pass but not non-anionic species, such as cations. The non-porous feature of the barrier inhibits fluid flow between first processing fluid 14 and second processing fluid 20 within reactor 10 in FIG. 1. Accordingly, an electric potential, a charge imbalance between the processing fluids, and/or differences in the concentrations of substances in the processing fluids can drive anions across an anion permeable barrier. In comparison to porous barriers, nonporous barriers are characterized by having little or no porosity or open space. In a normal electroplating reactor, nonporous barriers generally do not permit fluid flow when the pressure differential across the barrier is less than about 6 psi. Because the nonporous barriers are substantially free of open area, fluid is inhibited from passing through the nonporous barrier. Water, however, may be transported through the nonporous barrier via osmosis and/or electro-osmosis. Osmosis can occur when the molar concentration in the first and second processing fluids are substantially different. Electro-osmosis occurs as water is carried through the nonporous barrier with current-carrying ions in the form of a hydration sphere. When the first and second processing fluids have similar molar concentrations and no electrical current is passed through the processing fluids, fluid flow between the first and second processing fluids via the nonporous barrier is substantially prevented.

A nonporous bather can be hydrophilic so that bubbles in the processing fluids do not cause portions of the bather to dry, which reduces conductivity through the barrier. Exemplary nonporous barriers include Ionac® membranes manufactured by Sybron Chemicals, Inc., and NeoSepta® manufactured by Asahi Kasei Company.

In addition to the nonporous bathers described above, anion permeable bather can also be a porous barrier. Porous barriers include substantial amounts of open area or pores that permit fluid to pass through the porous barrier. Both ionic materials and nonionic materials are capable of passing through a porous barrier; however, passage of certain materials may be limited or restricted if the materials are of a size that allows the porous barrier to inhibit their passage. While useful porous barriers may limit the chemical transport (via diffusion and/or convection) of some materials in the first processing fluid and the second processing fluid, they allow migration of anionic species (enhanced passage of current) during application of electric fields associated with electrolytic processing. In the context of electrolytic processing a useful porous barrier enables migration of anionic species across the porous barrier while substantially limiting diffusion or mixing (i.e., transport across the barrier) of larger organic components and other non-anionic components between the anolyte and catholyte. Thus, porous barriers permit maintaining different chemical compositions for the anolyte and the catholyte. The porous barriers should be chemically compatible with the processing fluids over extended operational time periods. Examples of suitable porous barrier layers include porous glasses (e.g., glass frits made by sintering fine glass powder), porous ceramics (e.g., alumina and zirconia), silica aerogel, organic aerogels (e.g., resorcinol formaldehyde aerogel), and porous polymeric materials, such as expanded Teflon® (Gortex®). Suitable porous ceramics include grade P-6-C available from CoorsTek of Golden, Colo. An example of a porous barrier is a suitable porous plastic, such as Kynar™, a sintered polyethylene or polypropylene. Suitable materials can have a porosity (void faction) of about 25%-85% by volume with average pore sizes ranging from about 0.5 to about 20 micrometers. Such porous plastic materials are available from Poretex Corporation of Fairburn, Ga. These porous plastics may be made from three separate layers of material that include a thin, small pore size material sandwiched between two thicker, larger pore-sized sheets. An example of a product useful for the middle layer having a small pore size is CelGard™ 2400, made by CelGard Corporation, a division of Hoechst, of Charlotte, N.C. The outer layers of the sandwich construction can be a material such as ultra-fine grade sintered polyethylene sheet, available from Poretex Corporation. Porous barrier materials allow fluid flow across themselves in response to the application of pressures normally encountered in an electrochemical treatment process, e.g., pressures normally ranging from about 6 psi and below.

Inert anodes useful in processes described herein are also referred to as non-consumable anodes and/or dimensionally stable anodes and are of the type that when an electric potential is applied between a cathode and an anode in contact with an electrolyte solution, that there is no dissolution of the chemical species of the inert anode. Exemplary materials for inert anodes include platinum, ruthenium, ruthenium oxide, iridium, and other noble metals.

Consumable anodes useful in processes described herein are of the type that when an electric potential is applied between a cathode and an anode in contact with an electrolyte solution, dissolution of the chemical species making up the anode occurs. Exemplary materials for consumable anodes will include those materials that are to be deposited onto the microfeature workpiece, for example, copper, gold, tin, silver, lead, platinum, nickel, cobalt, zinc, and the like.

The temperature of the processing fluids can be chosen taking into consideration conventional factors such as complexing ability of the complexing agent, buffering capability of the buffer, metal ion concentration, volatile organics concentration, deposition potential of the complexed metal at the particular pH, solubility of the processing fluid constituents, stability of the processing fluids, desired deposit characteristics, and diffusion coefficients of the metal ions. Generally, temperatures ranging from about 20° C.-35° C. are suitable, although temperatures above or below this range may be useful.

As described above in the context of an electroplating process, oxidation of hydroxyl ions or water at the anode produces oxygen capable of oxidizing components in the catholyte. When an anion permeable barrier is absent, oxidation of components in the electrolyte can also occur directly at the anode. Oxidation of components in the electrolyte is undesirable because it is believed that the oxidized components contribute to variability in the properties (e.g. resistivity) of the metal deposits. Through the use of an anion permeable barrier, as described above, transfer of oxygen generated at the anode from the anolyte to the catholyte is minimized and/or prevented, and, thus, such oxygen is not available to oxidize components that are present in the catholyte. As discussed above, one way to address the problem of oxygen generated at the anode oxidizing components in the processing fluid is to frequently replace the processing fluid. Because of the time and cost associated with frequently replacing the processing fluid, the processes described herein provide an attractive alternative by allowing the processing fluids to be used in a large number of plating cycles without replacement. Use of the anion permeable barrier also isolates the anode from non-anionic components in the catholyte, e.g., complexing agent, that may otherwise be oxidized at the anode and adversely affect the ability of the catholyte to deposit features having resistivity properties that fall within acceptable ranges.

Figure 2:
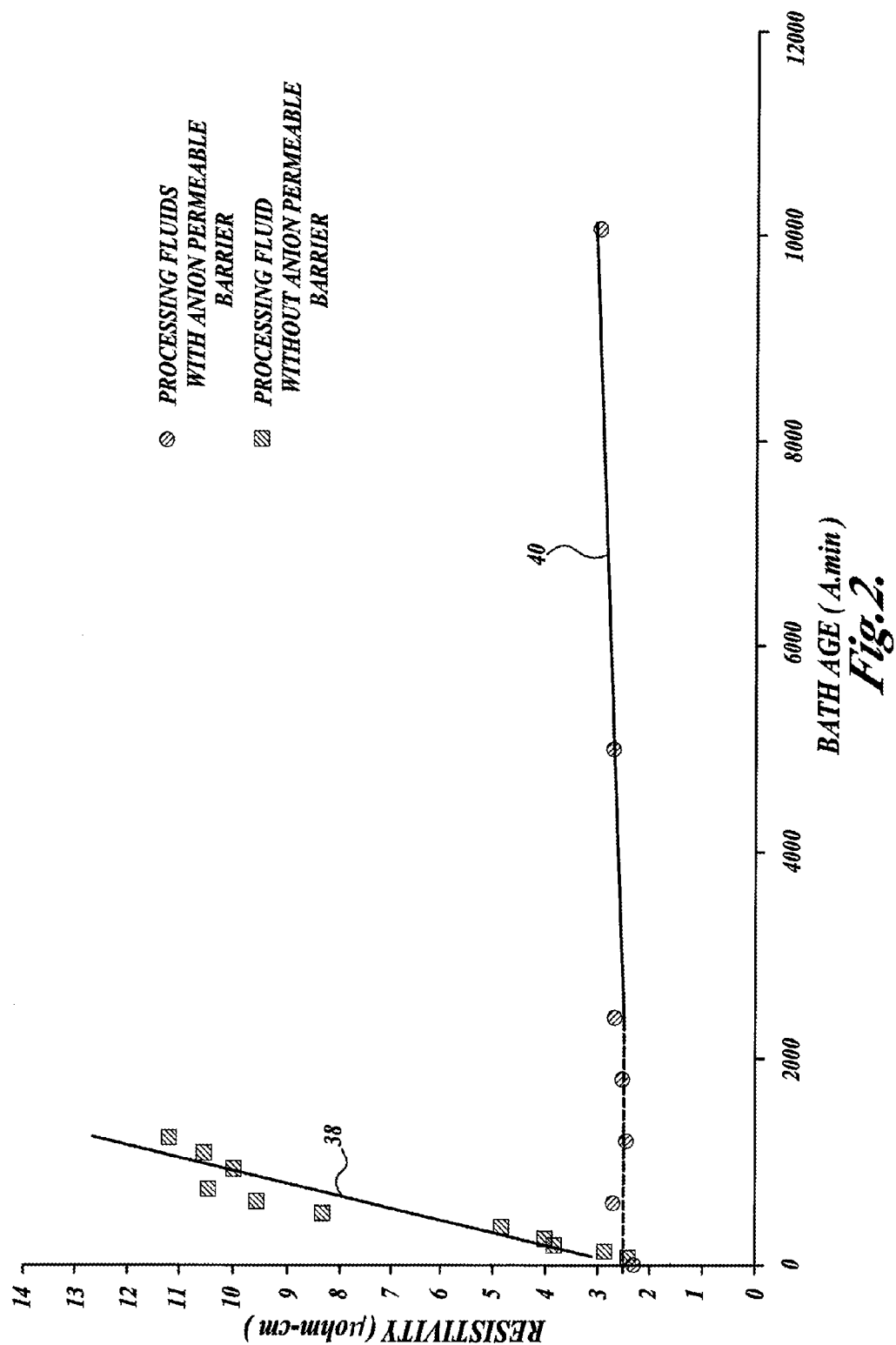
FIG. 2 graphically illustrates deposit resistivity as a function of bath age for a deposit formed using processing fluids separated by an anion permeable barrier and a deposit formed using a processing fluid without an anion permeable bather.

The resistivity of deposited metals as a function of the age of the processing fluid from which the deposit was formed is illustrated in FIG. 2. FIG. 2 illustrates how the use of processes described herein to deposit copper significantly extends the useful operating life of a catholyte compared to conventional processes using similar chemistries without an anion permeable barrier. FIG. 2 illustrates test results evaluating the resistivity of several 20 nanometer copper seed layers deposited using the same chemistry in contact with the workpiece. One set of copper seed layers was formed using a process that did not employ an anion permeable barrier and a second set of copper seed layers was formed using a process that employed an anion permeable barrier in accordance with a process described herein. More specifically the resistivity of a deposit was measured using a 4-pt resistivity probe from Creative Design Engineering, Inc. that measures the sheet resistance of a substrate. The resistivity of the copper films was obtained as the product of sheet resistance and thickness of the thin film. Several wafers with the same seed layer resistance were obtained, and their sheet resistance was pre-measured ($R_{PVD}$). The wafers were then plated in a chamber with no membranes, inert anodes, and a 9.5 pH electrolyte. A fixed amp time was applied for each wafer (0.7 amp-min for a 300 mm wafer corresponding to 20 nm Cu thickness), and a theoretical amount of Cu film deposited on the seed layer was obtained at the same current density. The wafers were then rinsed and dried in a spin rinse dryer. The wafers were then measured in the 4-pt probe again. This provided a post sheet resistance measurement ($R_{total}$). With the two sheet resistance measurements, the sheet resistance of just the film deposited was obtained through the method of parallel subtraction using the formula shown below and the sheet of resistance of the electrodeposited seed layer was obtained.

$$R_{ECD\ Seed} = (R_{PVD} * R_{total}) / (R_{PVD} - R_{total})$$

The resistivity of the deposited film was obtained by multiplying the thickness by the sheet resistance calculated above.

Resistivity of the electrodeposit=Thickness*
$R_{ECD\ Seed}$=20 nm*$R_{ECD\ Seed}$ Several such wafers were plated periodically, as the bath ages in terms of amp-min (dummy wafers were plated to age the bath).

Similar sets of wafers were plated using an anionic membrane as described herein. The chamber utilized the same electrolyte as the catholyte used to plate the first set of wafers described above. The anolyte was a fluid consisting of buffer, pH adjustment agent, and of the same pH as the catholyte as described herein. The wafers were plated with the same amp time as before under substantially identical conditions.

Similar calculations were performed and the resistivity of the electrodeposit was obtained as a function of bath age.

The resistivity of seed layers deposited using a process without an anion permeable barrier (line 38), increases rapidly with the age of the bath, increasing more than three times in under 2000 amp minutes. By comparison, the resistivity of copper seed layers deposited using a process that employed an anion permeable membrane as described herein, illustrated by line 40, increases only gradually over time such that little increase is observed even after 10,000 amp minutes. These results illustrate how a process described herein substantially extends the useful life of processing fluids used to deposit metal features onto a microfeature workpiece.

Another advantage of employing an anionic permeable barrier in the processes described herein is that the barrier prevents bubbles from the oxygen gas evolved at the anode from transferring to the catholyte. Bubbles in the catholyte are undesirable because they can cause voids or holes in the deposited features.

Another feature of processes described herein is that the pH adjustment agent, e.g., tetramethyl ammonium hydroxide, does not accumulate in the first processing fluid. As a result, pH adjustment agent need not be removed from the first processing fluid. This simplifies the maintenance of the first processing fluid.

In the foregoing descriptions, copper has been used as an example of a metal that can be used to enhance a seed layer or to form a metal feature directly onto a barrier layer. However, it should be understood that the basic principles of the processes described herein and their use for enhancement of an ultrathin metal layer prior to the bulk deposition of additional metal or the direct electroplating of a metal onto a barrier layer can be applied to other metals or alloys as well as deposition for other purposes. For example, gold is commonly used on for thin film head and III-V semiconductor applications. Gold ions can be electroplated using chloride or sulfite as the counter ion. As with copper, the chloride or sulfite counter ion would migrate across the anionic permeable barrier as described above in the context of copper. Potassium hydroxide could be used as the pH adjustment agent in a gold electroplating embodiment to counteract a drop in pH in the anolyte resulting from the oxidation of hydroxyl ions at the anode. As with the copper example described above, in the gold embodiment, gold chloride or gold sulfite, in the form of sodium gold sulfite or potassium gold sulfite could be added to the catholyte to replenish the gold deposited.

As mentioned previously, processes described above are useful for depositing more than one metal ion onto a microfeature workpiece surface. For example, processes described above are useful for depositing multi-component solders such as tin-silver solders. Other types of multi-component metal systems that can be deposited using processes described above include tin-copper, tin-silver-copper, lead-tin, nickel-iron, and tin-copper-antimony. Unlike certain copper features that are formed on the surfaces of microfeature workpieces, solder features tend to be used in packaging applications and are thus large compared to copper microfeatures. Because of their larger size, e.g., 10-200 microns, solder features are more susceptible to the presence of bubbles in processing fluids that can become entrapped and affect the quality of the solder deposits. A tin-silver solder system is an example of plating of a metal with multiple valence states. Generally, metals with multiple valence states can be plated from most of their stable states. Since the charge required to deposit any metal is directly proportional to the electrons required for the reduction, metals in their valence states closest to their neutral states consume less energy for reduction to metal. Unfortunately, most metals in their state closest to their neutral states are inherently unstable, and therefore production-worthy plating can be unfeasible. Through the use of processes for plating metal ions described above, plating solutions that include metals in this inherently unstable state can be applied in an effective process to deposit the desired metal. Through the use of the processes described above for depositing a metal, less oxidation of the inherently unstable metal species occurs, thus providing a more production-worthy process.

By way of illustration, most tin-silver plating solutions prefer Sn(II) as the species for tin plating. For such multi-component plating systems, control of tin and silver ions needs to be precise, and the use of silver or tin as an anode is not feasible. The use of such consumable anodes could cause stability issues resulting from plating/reacting with the anodes, and they also create issues relating to the ability to uniformly replenish metal. On the other hand, the use of inert anodes avoids the foregoing issues, but introduces a new issue associated with the production of oxygen through the oxidation of water or hydroxyl ions at the inert anode. Such oxygen not only may oxidize other components in the plating bath, it may also oxidize the desired Sn(II) species to the more stable Sn(IV) ion, which is more difficult to plate onto a workpiece.

Figure 5:
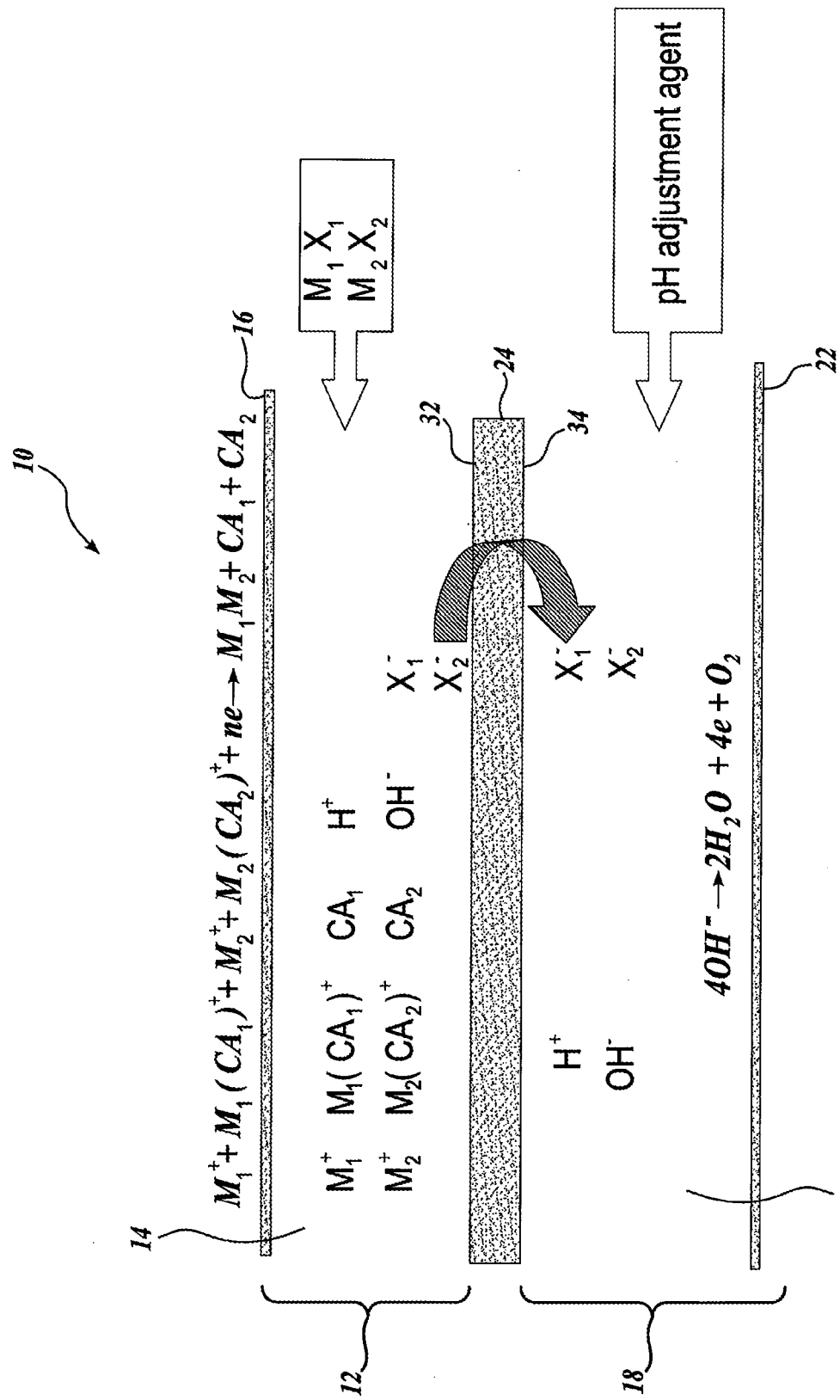
FIG. 5 is a schematic illustration of the chemistry and chemical reactions occurring in one embodiment of the processes for electroplating two metals described herein using an inert anode.

Referring to FIG. 5, a schematic illustration is provided for the operation of reactor 10 using an anion permeable barrier 24 and an inert anode 22 in combination with a first processing fluid and a second processing fluid suitable for depositing tin-silver solder. In the description that follows, processing fluid 14 in processing unit 12 is a catholyte containing metal ions $M_1^+$ and $M_2^+$, e.g., $Sn^{2+}$ and $Ag^+$ ions; counter ions $X_1^-$ and $X_2^-$ for the metal ions, e.g., methane sulfonate $CH_3SO_3^-$; complexing agents $CA_1$ and $CA_2$, e.g., proprietary organic additives, chelated with the metal ions. As discussed above in the context of the electroplating of copper, the specific hydrogen ion concentration in catholyte 14 can be chosen taking into consideration conventional factors such as complexing ability of the complexing agent, buffering capability of the buffer, metal ion concentrations, volatile organics concentrations, alloy deposition potential of the complex at the particular pH, solubility of the catholyte constituents, stability of the catholyte, desired characteristics of the deposits, and diffusion coefficients of the metal ions.

The discussions above regarding the concentration of $H^+$ in the anolyte and catholyte, relative concentrations of the buffer in the anolyte and the catholyte, use of the pH adjustment agent, replenishment of the metal ions, cathodic reduction reactions, and anodic oxidation reactions in the context of the electroplating of copper are equally applicable to a tin-silver system. The particular operating conditions that are most desirable are related to the specific chemistry being used.

As with the copper plating process, an electric potential applied between cathode 16 and anode 22 results in tin ions and silver ions being reduced at cathode 16 and deposited thereon. The methane sulfonate (MSA) counter ion ($CH_3SO_3^-$) accumulates in the catholyte near a first surface 32 of anion permeable barrier 24. As with the copper system, at positively charged anode 22, hydroxyl ions are converted to water and oxygen and/or water is decomposed to hydrogen ions and oxygen. The resulting electrical charge gradient causes negatively charged MSA ions ($CH_3SO_3^-$) to move from first surface 32 of anion permeable barrier 24 to the second surface 34 of anion permeable barrier 24. The transfer of negatively charged MSA ions ($CH_3SO_3^-$) from catholyte 14 to anolyte 20 during the plating cycle maintains the charge balance of reactor 10. Tin and silver ions that are deposited onto cathode 16 can be replenished by the addition of a solution of tin methane sulfonate and silver methane sulfonate to the catholyte. During the plating cycle, MSA ions that are introduced to catholyte 14 as a result of the addition of the tin MSA and silver MSA transfer across anion permeable barrier 24 to anolyte 20. As with the copper process, portions of the anolyte can be removed from counter electrode unit 18 to avoid the buildup of MSA ions in the anolyte.

Figure 6:
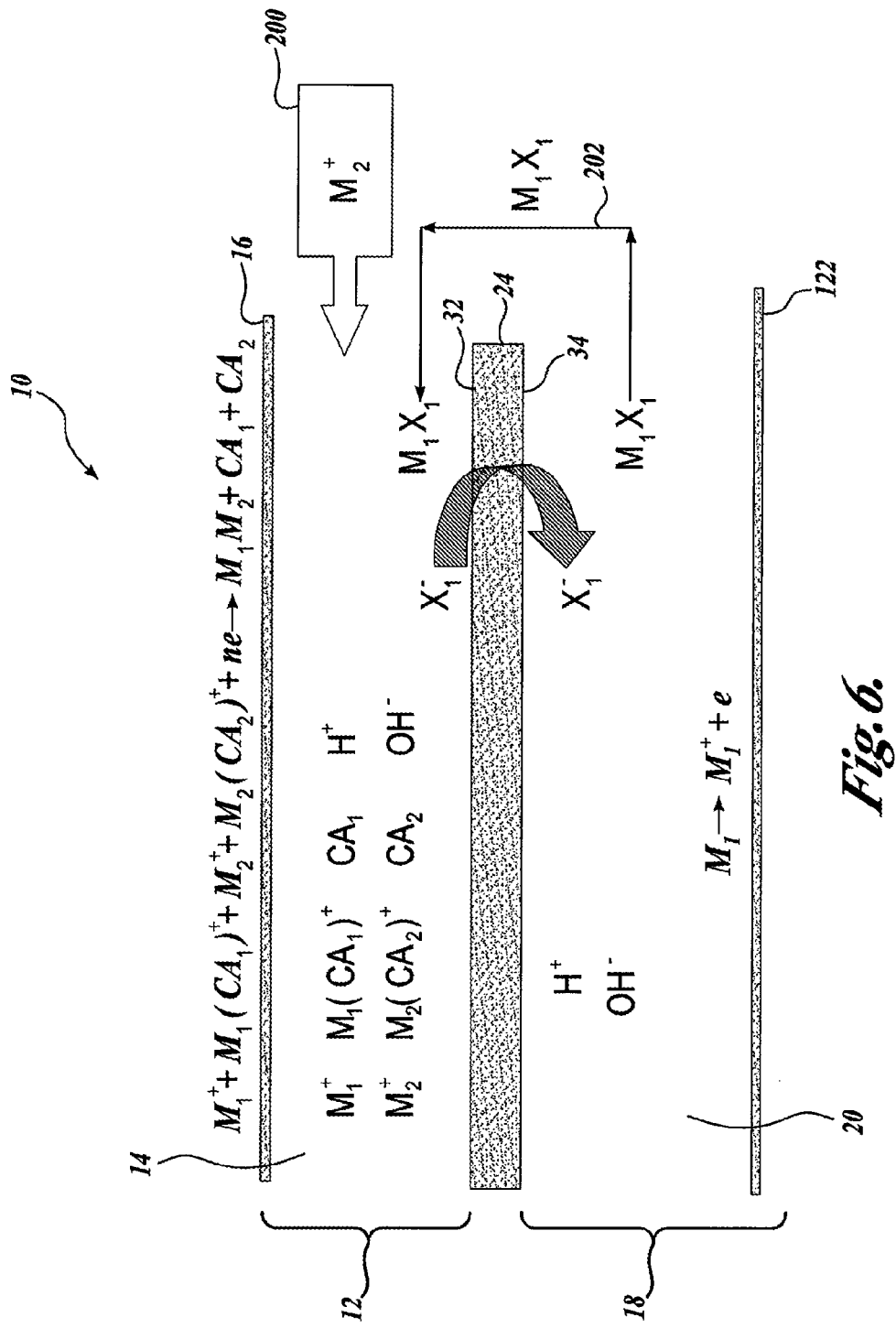
FIG. 6 is a schematic illustration of the chemistry and chemical reactions occurring in one embodiment of the processes for electroplating two metals described herein using a consumable anode.

Referring to FIG. 6, in a different embodiment, electroplating of two metals, e.g., tin and silver, can also be achieved using a consumable anode 122. Referring to FIG. 6, the catholyte 14 in processing unit 12 is similar to the catholyte described with reference to FIG. 5. In the process depicted in FIG. 6, metal ion $M_2^+$ is introduced into processing unit 12 from source 200, metal ion $M_1^+$ is supplied to counter electrode unit 18 through oxidation of metal making up consumable anode 122. Metal ion $M_1^+$ combines with counter ion $X_1^-$ to form the metal salt $M_1X_1$ in counter electrode unit 18 and is then delivered via line 202 to processing unit 12. Metal salt $M_1X_1$ delivered to processing unit 12 dissociates therein to provide a source of metal ion $M_1^+$ that can be reduced at cathode 16 and deposited thereon as described above with reference to FIG. 5. In accordance with this embodiment, complexing agents $CA_1$ and $CA_2$ are present in catholyte 14 where they can complex with metal ions $M_1^+$ and $M_2^+$. Suitable pH adjustment agents and pH buffers may be present and/or added to the catholyte and anolyte. The charge balance within reactor 10 can be maintained through the transfer of negatively charged counter ion $X_1^-$ in processing unit 12 across anion permeable membrane 24 into counter electrode unit 18.

Figure 7:
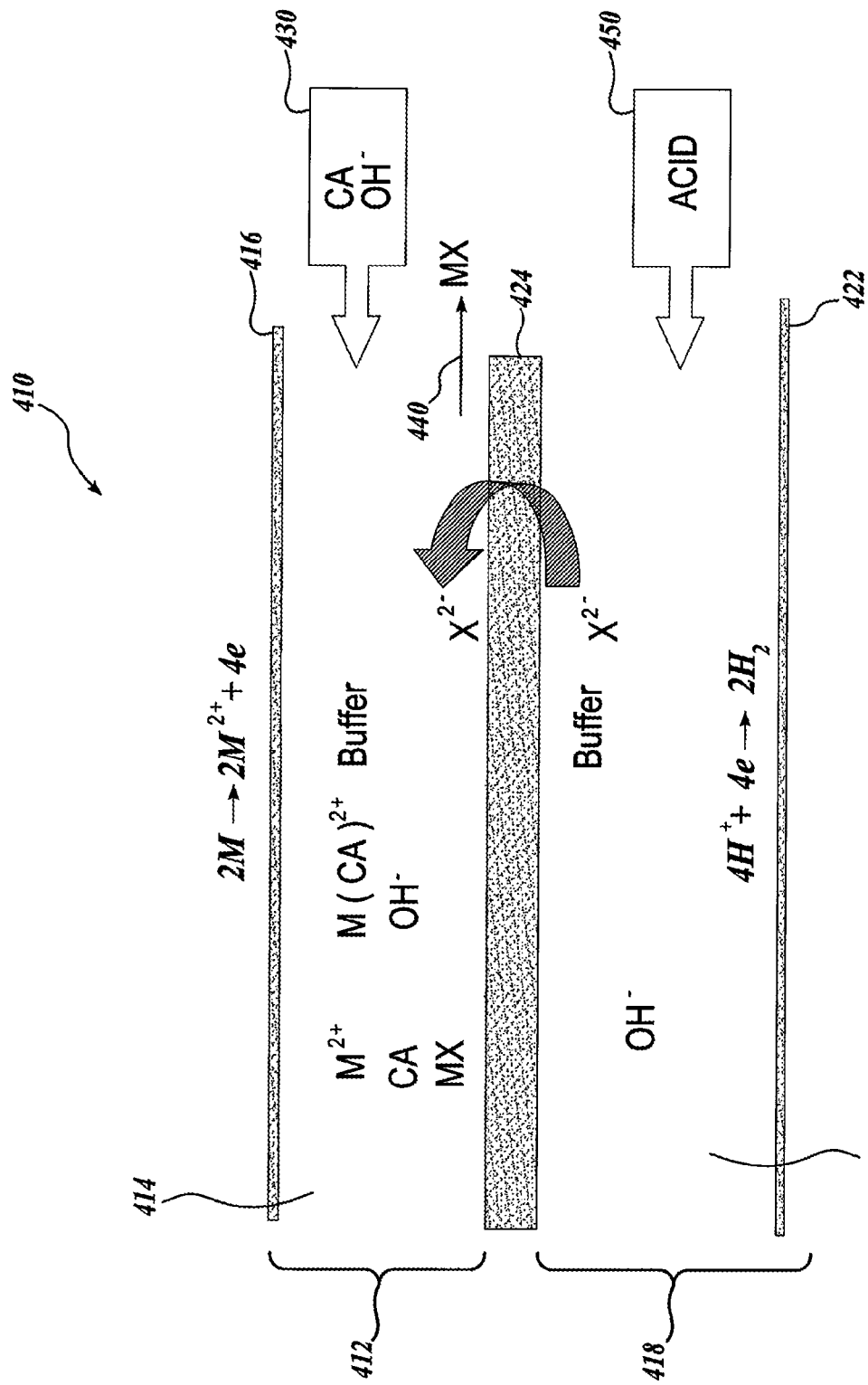
FIG. 7 is a schematic illustration of the chemistry and chemical reactions occurring in one embodiment of the processes for deplating a metal described herein.

Metal can be deplated from a microfeature workpiece by reversing the bias of the electric field created between the microfeature workpiece and the working electrode. Referring to FIG. 7, a microfeature workpiece 416 is provided that carries a metal M, e.g., copper, on its surface. Microfeature workpiece 416 is contacted with a first processing fluid 414 in processing unit 412. Processing fluid 414 includes metal ions $M^{2+}$, e.g., copper ions; a complexing agent CA, e.g., ethylene diamine tetraacetic acid; a metal salt MX, e.g., copper sulfate; a complexed metal ion $M(CA)^{2+}$; hydroxyl ions; a buffer, and a counter ion $X^{2-}$, e.g., sulfate ion. First processing unit 412 is separated from a counter electrode unit 418 by anion permeable membrane 424. Counter electrode unit 418 includes counter electrode 422 and a second processing fluid 420. In a deplating process, microfeature workpiece 416, the working electrode, is an anode, and counter electrode 422 is the cathode. Processing unit 412 is also in fluid communication with a source 430 of complexing agent CA and hydroxyl ions. In addition, processing unit 412 can be provided with a mechanism 440 for removing metal salts therefrom. Counter electrode unit 418 is in fluid communication with a source 450 of acid. Through the application of an electric potential between anode 416 and cathode 422, hydrogen ions are reduced at the cathode 422 to produce hydrogen gas. Copper on the surface of microfeature workpiece 416 is oxidized resulting in copper ions being removed from the surface of the microfeature workpiece. The charge balance within reactor 410 is maintained through the transfer of counter ion $X^{2-}$ from catholyte 420 to anolyte 414 through anion permeable membrane 424.

Catholyte 420 in counter electrode unit 418 includes hydroxyl ions, buffer, and counter ion $X^{2-}$. The acid that is added to counter electrode unit 418 can be both a source of counter ion $X^{2-}$ as well as a pH adjustment agent. In order to reduce or eliminate transfer of buffer components across anionic permeable membrane 424, the buffer concentration in anolyte 414 can be maintained at a level equal to or greater than the concentration of buffer in catholyte 420.

Figure 8:
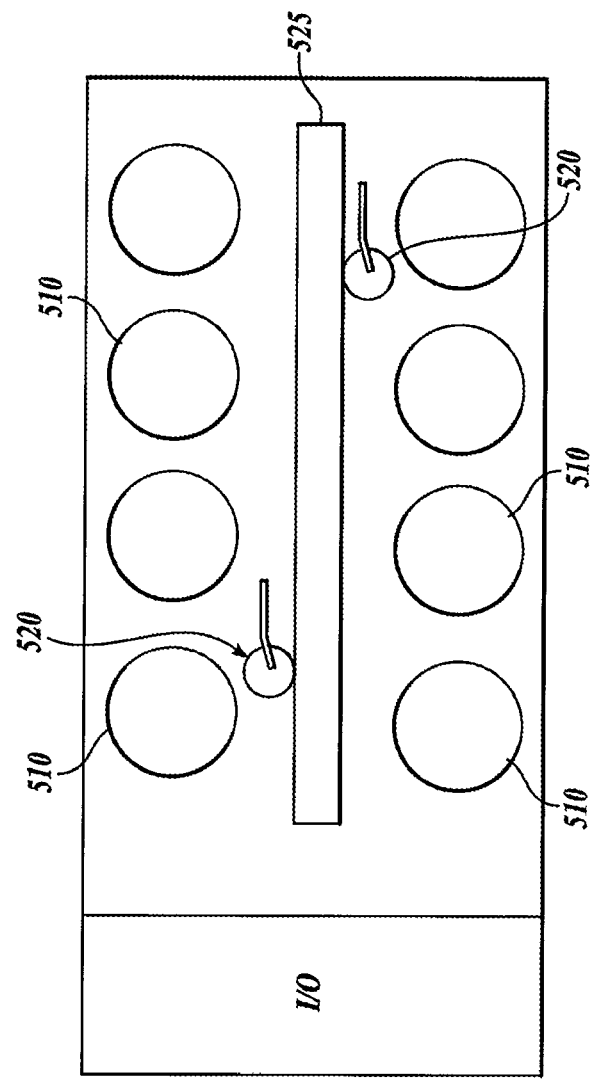
FIG. 8 is a schematic illustration of a tool that includes chambers for carrying out processes described herein.

One or more of the reactors for electrolytically treating a microfeature workpiece or systems including such reactors may be integrated into a processing tool that is capable of executing a plurality of methods on a workpiece. One such processing tool is an electroplating apparatus available from Semitool, Inc., of Kalispell, Montana. Referring to FIG. 8, such a processing tool may include a plurality of processing stations 510, one or more of which may be designed to carry out an electrolytic processing of a microfeature workpiece with a high pH first processing fluid and an inert anode as described above. Other suitable processing stations include one or more rinsing/drying stations and other stations for carrying out wet chemical processing. The tool also includes a robotic member 520 that is carried on a central track 525 for delivering workpieces from an input/output location to the various processing stations.

Figure 3:
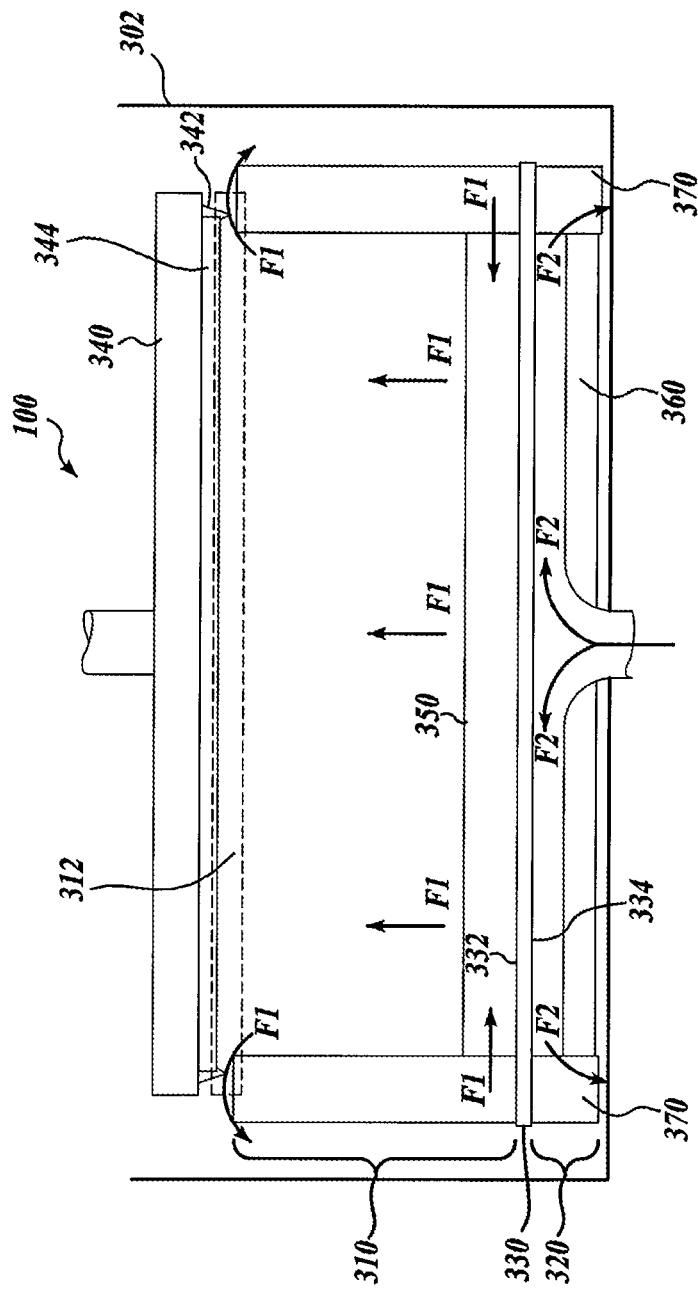
FIG. 3 is a schematic illustration of a chamber for carrying out processes described herein.

Referring to FIG. 3, a more detailed schematic illustration of one design of a reactor 100 for electroplating metals onto seed layers, directly electroplating metal onto barrier layers, or otherwise depositing materials onto workpieces is illustrated. Reactor 100 includes a vessel 302, a processing chamber 310 configured to direct a flow of first processing fluid to a processing zone 312, and an anode chamber 320 configured to contain a second processing fluid separate from the first processing fluid. An anion permeable barrier 330 separates the first processing fluid in the processing unit 310 from the second processing fluid in the anode chamber 320. Reactor 100 further includes a workpiece holder 340 having a plurality of electrical contacts 342 for applying an electric potential to a workpiece 344 mounted to workpiece holder 340. Workpiece holder 340 can be a movable head configured to position workpiece 344 in processing zone 312 of processing unit 310, and workpiece holder 340 can be configured to rotate workpiece 344 in processing zone 312. Suitable workpiece holders are described in U.S. Pat. Nos. 6,080,291; 6,527,925; 6,773,560, and U.S. patent application Ser. No. 10/497,460; all of which are incorporated herein by reference.

Reactor 100 further includes a support member 350 in the processing chamber 310 and a counter electrode 360 in the anode chamber 320. Support member 350 spaces the anion permeable barrier 330 apart from workpiece processing zone 312 by a controlled distance. This feature provides better control of the electric field at processing zone 312 because the distance between the anion permeable barrier 330 and workpiece processing zone 312 affects the field strength at processing zone 312. Support member 350 generally contacts first surface 332 of anion permeable barrier 330 such that the distance between first surface 332 and processing zone 312 is substantially the same across processing chamber 310. Another feature of support member 350 is that it also shapes anion permeable barrier 330 so that bubbles do not collect along a second side 334 of anion permeable barrier 330.

Support member 350 is configured to direct flow $F_1$ of a first processing fluid laterally across first surface 332 of anion permeable barrier 330 and vertically to processing zone 312. Support member 350 accordingly controls the flow $F_1$ of the first processing fluid in processing chamber 310 to provide the desired mass transfer characteristics in processing zone 312. Support member 350 also shapes the electric field in processing chamber 310.

Counter electrode 360 is spaced apart from second surface 334 of anion permeable barrier 330 such that a flow $F_2$ of the second processing fluid moves regularly outward across second surface 334 of anion permeable barrier 330 at a relatively high velocity. Flow $F_2$ of the second processing fluid sweeps oxygen bubbles and/or particles from the anion permeable barrier 330. Reactor 100 further includes flow restrictor 370 around counter electrode 360. Flow restrictor 370 is a porous material that creates a back pressure in anode chamber 320 to provide a uniform flow between counter electrode 360 and second surface 334 of the anion permeable barrier 330. As a result, the electric field can be consistently maintained because flow restrictor 370 mitigates velocity gradients in the second processing fluid where bubbles and/or particles can collect. The configuration of counter electrode 360 and flow restrictor 370 also maintains a pressure in the anode chamber 320 during plating that presses the anion permeable barrier 330 against support member 350 to impart the desired contour to anion permeable barrier 330.

Reactor 100 operates by positioning workpiece 344 in processing zone 312, directing flow $F_1$ of the first processing fluid through processing chamber 310, and directing the flow $F_2$ of the second processing fluid through anode chamber 320. As the first and second processing fluids flow through reactor 100, an electric potential is applied to workpiece 344 via electrical contacts 342 and counter electrode 360 to establish an electric field in processing chamber 310 and anode chamber 320.

Another useful reactor for depositing metals using processes described herein is described in U.S. Patent Application No. 2005/0087439, which is expressly incorporated herein by reference.

While illustrative embodiments have been illustrated and described, it will be appreciated that various changes can be made therein without departing from the spirit and scope of the disclosure.

The invention claimed is:

1. A process for electrolytically processing a microfeature workpiece as the working electrode with a first processing fluid and a counter electrode comprising:

providing a microfeature workpiece comprising a nonmetallic substrate having a dielectric layer disposed over the substrate and a continuous metal feature disposed on the dielectric layer and having microfeatures comprising recessed structures;

contacting a surface of the microfeature workpiece with the first processing fluid, the first processing fluid comprising first processing fluid species including one or more cations, an anion, and a complexing agent;

contacting the counter electrode with a second processing fluid;

producing an electrochemical reaction at the counter electrode;

providing an anion permeable barrier between the first processing fluid and the second processing fluid to substantially prevent movement of cationic species and the complexing agent between the first processing fluid and the second processing fluid; and depositing the one or more cations as metal into the recessed structures on the surface of the microfeature workpiece.

2. The process of claim 1, wherein the one or more cations is selected from the group consisting of copper ion, gold ion, tin ion, silver ion, platinum ion, ruthenium ion, rhodium ion, iridium ion, osmium ion, rhenium ion, palladium ion, and nickel ion.

3. The process of claim 1, wherein the one or more cations are cations of a single metal selected from the group consisting of copper ion, gold ion, tin ion, silver ion, platinum ion, ruthenium ion, rhodium ion, iridium ion, osmium ion, rhenium ion, palladium ion, and nickel ion.

4. The process of claim 1, wherein the cations are provided from a solution of one or more metal salts.

5. The process of claim 4, wherein the one or more metal salts are selected from the group consisting of gluconates, cyanides, sulfamates, citrates, fluoroborates, pyrophosphates, sulfates, chlorides, sulfides, chlorites, sulfites, nitrates, nitrites, and methane sulfonates.

6. The process of claim 1, wherein the anion permeable barrier is an anion exchange membrane.

7. The process of claim 1, wherein the working electrode is a cathode, and the counter electrode is an anode.

8. The process of claim 7, wherein the cation of the first processing fluid is a metal ion, and further comprising the step of electrolytically depositing the metal ion onto the surface of the microfeature workpiece.

9. The process of claim 7, wherein the first processing fluid further includes at least one counter anion of the one or more cations and the process further comprises the step of passing the counter anion from the first processing fluid to the second processing fluid through the anion permeable barrier.

10. The process of claim 7, wherein the anode is selected from the group consisting of an inert anode and a consumable anode.

11. The process of claim 1, further comprising the step of passing the anion between the first processing fluid and the second processing fluid through the anion permeable barrier.

12. The process of claim 1, wherein the complexing agent is selected from compounds that contain a nitrogen-containing chelating group R—$NR_2$—$R_1$, where R is any alkyl or aromatic group and $R_1$ and $R_2$ are H, alkyl or aryl organic groups or polymer chains.

13. The process of claim 1, further comprising the step of depositing the cation as metal onto the surface of the microfeature workpiece.

14. The process of claim 13, further comprising using the anion as a major charge carrier to support the deposition.

15. The process of claim 13, further comprising replenishing the cation concentration in the first processing fluid.

16. The process of claim 15, using the anion permeable barrier to reduce the anion concentration in the first processing fluid.

17. The process of claim 1, wherein the working electrode is an anode, and the counter electrode is a cathode.

18. The process of claim 17, further comprising the step of electrolytically dissolving metal from the surface of the microfeature workpiece.

19. A process for electrolytically processing a microfeature workpiece as the working electrode with a first processing fluid and a counter electrode comprising:
- contacting a surface of the microfeature workpiece with the first processing fluid, the first processing fluid comprising first processing fluid species including one or more cations, an anion, and a complexing agent, wherein the first processing fluid has a pH greater than 7.0;
- contacting the counter electrode with a second processing fluid;
- producing an electrochemical reaction at the counter electrode;
- providing an anion permeable barrier between the first processing fluid and the second processing fluid to substantially prevent movement of cationic species and the complexing agent between the first processing fluid and the second processing fluid; and
- depositing the one or more cations as metal into recessed structures on the surface of the microfeature workpiece and removing metal from the surface of the microfeature workpiece to form a microelectronic circuit.

20. A process for electrolytically processing a microfeature workpiece as the working electrode with a first processing fluid and a counter electrode comprising:
- providing a microfeature workpiece comprising a nonmetallic substrate having a dielectric layer disposed over the substrate and a continuous metal feature disposed on the dielectric layer and having microfeatures comprising recessed structures;
- contacting a surface of the microfeature workpiece with the first processing fluid, the first processing fluid comprising first processing fluid species including one or more cations, an anion, and a complexing agent, wherein the complexing agent is selected from the group consisting of ethylene diamine, ethylene diamine tetraacetic acid and its salts, cyclam, porphrin, bipyridyl, pyrolle, thiophene, and polyamines;
- contacting the counter electrode with a second processing fluid;
- producing an electrochemical reaction at the counter electrode;
- providing an anion permeable barrier between the first processing fluid and the second processing fluid to substantially prevent movement of cationic species and the complexing agent between the first processing fluid and the second processing fluid; and
- depositing the one or more cations as metal into the recessed structures on the surface of the microfeature workpiece.

21. A process for electrolytically processing a microfeature workpiece as the working electrode with a first processing fluid and a counter electrode comprising:
- providing a microfeature workpiece comprising a nonmetallic substrate having a dielectric layer disposed over the substrate and a continuous metal feature disposed on the dielectric layer and having microfeatures comprising recessed structures;
- contacting a surface of the microfeature workpiece with the first processing fluid, the first processing fluid comprising first processing fluid species including one or more cations, an anion, and a complexing agent, wherein the complexing agent includes chemical compounds having at least one part with the chemical structure $COOR_1$—$COHR_2R_3$ where $R_1$ is an organic group covalently bound to the carboxylate group (COO), $R_2$ is either hydrogen or an organic group, and $R_3$ is either hydrogen or an organic group;
- contacting the counter electrode with a second processing fluid;
- producing an electrochemical reaction at the counter electrode;
- providing an anion permeable barrier between the first processing fluid and the second processing fluid to substantially prevent movement of cationic species and the complexing agent between the first processing fluid and the second processing fluid; and
- depositing the one or more cations as metal into the recessed structures on the surface of the microfeature workpiece.

22. The process of claim 21, wherein the complexing agent is selected from the group consisting of citric acid and salts thereof, tartaric acid and salts thereof, diethyltartrate, diisopropyltartrate, and dimethyltartrate.

23. A process for electrolytically processing a microfeature workpiece as the working electrode with a first processing fluid and a counter electrode comprising:
- contacting a surface of the microfeature workpiece with the first processing fluid, the first processing fluid comprising first processing fluid species including one or more cations, an anion, and a complexing agent;
- contacting the counter electrode with a second processing fluid;
- producing an electrochemical reaction at the counter electrode;
- providing an anion permeable barrier between the first processing fluid and the second processing fluid to substantially prevent movement of cationic species and the complexing agent between the first processing fluid and the second processing fluid; and
- further comprising the step of depositing the one or more cations as metal into recessed structures on the surface of the microfeature workpiece; wherein the surface onto which the cation is deposited is selected from the group consisting of a seed material and a barrier material.

24. A process for electrolytically processing a microfeature workpiece as the working electrode with a first processing fluid and a counter electrode comprising:
- contacting a surface of the microfeature workpiece with the first processing fluid, the first processing fluid comprising first processing fluid species including one or more cations, an anion, and a complexing agent;
- contacting the counter electrode with a second processing fluid;
- producing an electrochemical reaction at the counter electrode;
- substantially preventing the movement of the cationic species and the complexing agent between the first processing fluid and the second processing fluid by extending an anion permeable barrier between the first processing fluid and the second processing fluid; and
- depositing the one or more cations as metal into recessed structures on the surface of the microfeature workpiece, and removing metal from the surface of the microfeature workpiece to form a microelectronic circuit.

25. A process for electrolytically processing a microfeature workpiece as the working electrode with a first processing fluid and a counter electrode comprising:
- providing a microfeature workpiece comprising a nonmetallic substrate having a dielectric layer disposed over the substrate and a continuous metal feature disposed on the dielectric layer and having microfeatures comprising recessed structures;
- contacting a surface of the microfeature workpiece with the first processing fluid, the first processing fluid comprising first processing fluid species including a cation selected from the group consisting of copper ion, gold ion, tin ion, silver ion, platinum ion, ruthenium ion, rhodium ion, iridium ion, osmium ion, rhenium ion, palladium ion, and nickel ion, an anion, and a complexing agent;
- contacting the counter electrode with a second processing fluid, wherein the second processing fluid includes no cation or a lower concentration of cation than the first processing fluid;
- producing an electrochemical reaction at the counter electrode;
- substantially preventing the movement of the cationic species and the complexing agent between the first processing fluid and the second processing fluid species by separating the first processing fluid from the second processing fluid with an anion permeable barrier; and
- depositing the one or more cations as metal into the recessed structures on the surface of the microfeature workpiece.

* * * * *